United States Patent [19]

Walczak et al.

[11] Patent Number: 4,523,155
[45] Date of Patent: Jun. 11, 1985

[54] TEMPERATURE COMPENSATED AUTOMATIC OUTPUT CONTROL CIRCUITRY FOR RF SIGNAL POWER AMPLIFIERS WITH WIDE DYNAMIC RANGE

[75] Inventors: Thomas J. Walczak, Palatine; Richard M. Stone, Schaumburg; Gary M. Cristiano, Itasca, all of Ill.

[73] Assignee: Motorola, Inc., Schaumburg, Ill.

[21] Appl. No.: 682,805

[22] Filed: Dec. 17, 1984

Related U.S. Application Data

[63] Continuation of Ser. No. 491,499, May 4, 1983, abandoned.

[51] Int. Cl.$^3$ .................................................. H03G 3/30
[52] U.S. Cl. ..................................... 330/279; 330/289
[58] Field of Search ............. 330/129, 278, 279, 284, 330/289, 298; 455/117

[56] References Cited

U.S. PATENT DOCUMENTS

| | | | |
|---|---|---|---|
| 3,449,680 | 6/1969 | Schilb et al. ............... | 455/117 X |
| 3,496,415 | 2/1970 | Ruthenberg et al. .......... | 317/20 |
| 3,641,451 | 2/1972 | Hollingsworth et al. ....... | 330/134 |
| 3,646,397 | 2/1972 | Ruthenberg et al. .......... | 317/16 |
| 3,651,379 | 3/1972 | Moisand et al. ............. | 317/41 |
| 3,652,947 | 2/1972 | Hollingsworth .............. | 330/15 |
| 3,652,948 | 2/1972 | Fierstein et al. ........... | 330/15 |
| 3,671,878 | 6/1972 | Becker ..................... | 330/207 |
| 3,866,136 | 2/1975 | Augustin ................... | 330/207 |
| 3,988,644 | 10/1976 | Krone ..................... | 317/33 |
| 4,001,711 | 1/1977 | Knutson et al. ............. | 330/66 |
| 4,019,150 | 4/1977 | Lurey et al. ............... | 330/2 |
| 4,041,396 | 8/1977 | Fedde ...................... | 325/150 |
| 4,114,108 | 9/1978 | Faulkenberry et al. ........ | 330/207 |
| 4,122,400 | 10/1978 | Medendorp et al. .......... | 330/207 |
| 4,146,847 | 3/1979 | Otao et al. ................ | 330/297 |
| 4,287,466 | 9/1981 | Quick ...................... | 323/275 |
| 4,313,210 | 1/1982 | Hume et al. ................ | 455/117 |
| 4,367,443 | 1/1983 | Hull et al. ................ | 330/207 |
| 4,446,440 | 5/1984 | Bell ....................... | 330/10 |
| 4,447,783 | 5/1984 | Quick ...................... | 323/275 |

OTHER PUBLICATIONS

"Advanced Mobile Phone System", 800 MHz High Capacity Mobile Radiotelephone, Manual #68P81039E25-A, Motorola, Inc. Service Publications, 1301 E. Algonquin Road, Schaumburg, IL 60172.

OKI Advanced Communications; Equipment Manual Published by FCC, 1-4-83, FIG. 3-2, (Part of FCC Type Acceptance Documents).

Primary Examiner—James B. Mullins
Assistant Examiner—Steven J. Mottola
Attorney, Agent, or Firm—James W. Gillman; Rolland R. Hackbart; Raymond A. Jenski

[57] ABSTRACT

Improved temperature compensated, automatic output control (AOC) circuitry for RF signal power amplifiers is described that maintains the output power within one-half dB of a selected one of eight power levels varying from nine milliwatts to five watts, a dynamic range of twenty-eight dB. The amplification of the RF signal amplifier is proportional to a drive current signal provided by a current amplifier. A half-wave rectifier is coupled to the output of final amplifiers for generating an output power signal that has a magnitude proportional to the output power. The half-wave rectifier is temperature compensated for and biased by a diode coupled to the rectifier by one resistor and coupled to supply voltage by another resistor. The output power voltage is further coupled to an amplifier having an amplification factor selected by level control signals. The amplified output power signal is coupled to a comparator which varies the drive current provided by the current amplifier in response to the voltage difference between the amplified output power signal and a reference voltage.

85 Claims, 2 Drawing Figures

TEMPERATURE COMPENSATED AUTOMATIC OUTPUT CONTROL CIRCUITRY FOR RF SIGNAL POWER AMPLIFIERS WITH WIDE DYNAMIC RANGE

This is a continuation of application Ser. No. 491,499, filed 5/4/83 abandoned.

BACKGROUND OF THE INVENTION

The present invention is related generally to control circuits for RF signal power amplifiers, and more particularly to improved, temperature compensated, automatic output control circuitry for RF signal power amplifiers.

Prior art power amplifiers typically only have one output power level. Such power amplifiers were adjusted during manufacture to the desired output power level. In some applications, it was desirable to have two power settings, a low and a high setting. The RF signal power amplifier for such applications would have one setting for the high power level and another for the low power level.

More recently, it has become advantageous to reuse radio channels in some radio communications systems. Therefore, in order to avoid interference between two RF signal power amplifiers using the same frequency, it is desirable to have many different selectable output power levels. For example, four different power levels are provided for in the RF signal power amplifier in the mobile radiotelephone described in Motorola Instruction Manual No. 68P81039E25, entitled "Advanced Mobile Phone System", and published by Motorola Service Publications, 1301 E. Algonquin Road, Schaumburg, IL, 1979. The four power levels are produced by varying reference voltage which is applied to automatic output control circuitry. However, such automatic output control circuitry cannot accurately maintain a wide range of power settings in RF signal power amplifiers operable at several different RF signal frequencies and subjected to a wide range of temperatures.

OBJECTS AND SUMMARY OF THE INVENTION

Accordingly, it is an object of the present invention to provide, improved temperature compensated, automatic output control circuitry for RF signal power amplifiers that accurately maintains over a wide range of RF signal frequencies and temperatures output power levels selected from a wide range of power settings.

Briefly described, the present invention encompasses control circuitry for maintaining the magnitude of an RF signal from an RF signal amplifier at one of a plurality of levels selected by level control signals from a signal source. The amplification of the RF signal amplifier is proportional to a drive current signal provided by a current amplifier. The current amplifier varies the magnitude of the drive current signal in response to a current control signal. The control circuitry further includes circuitry for generating an output power signal that has a magnitude proportional to the magnitude of the RF signal from the RF signal amplifier; circuitry for compensating the output power signal for variations in temperature; circuitry for selecting, in response to the level control signals, one of a plurality of adjustment factors, such as amplification or attenuation factors circuitry for amplifying the output power signal by the selected amplification factor; and circuitry for varying the magnitude of the current control signal in response to the difference between the magnitude of the amplified output power signal and a predetermined magnitude.

DETAILED DESCRIPTION OF THE PREFERRED EMBODIMENT

Figure 1:
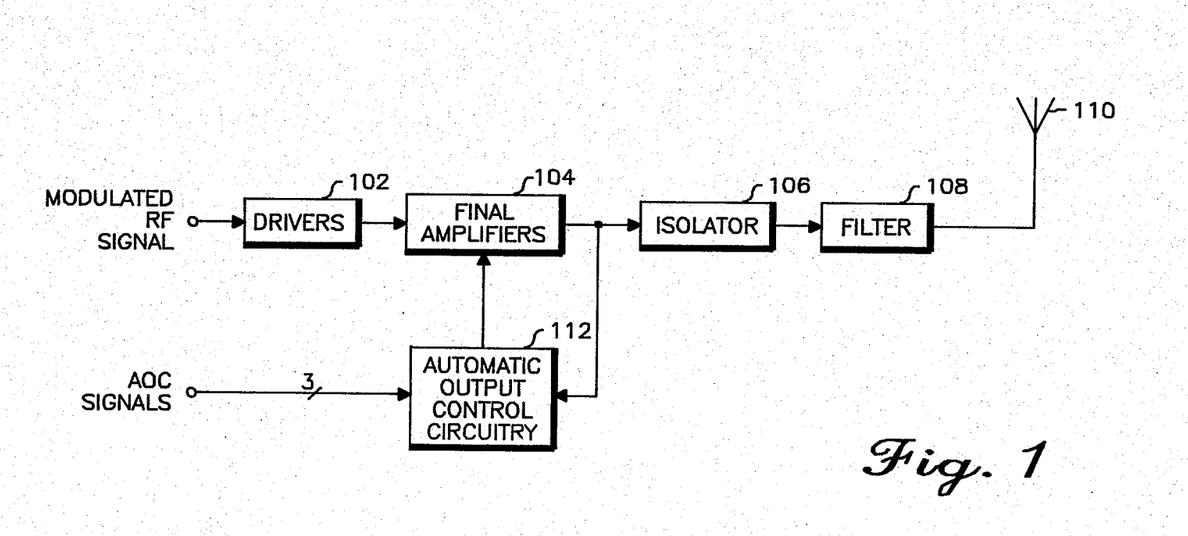
FIG. 1 is a block diagram of an RF signal amplifier including the automatic output control circuitry of the present invention.

Referring to FIG. 1, there is illustrated an RF signal power amplifier that may advantageously utilize automatic output control (AOC) circuitry embodying the present invention. An RF signal power amplifier is typically part of a radio, such as that described in the aforementioned instruction manual number 68P81039E25, that includes an RF signal power amplifier for amplifying a modulated RF signal which is radiated by an antenna. The RF signal power amplifier in FIG. 1 includes two cascaded stages of amplification, drivers 102 and final amplifiers 104. The output of final amplifier 104 is coupled by way of isolator 106 and filter 108 to antenna 110. The final amplifiers 104 typically boost the output power level from approximately one-fourth watt to five or more watts. The output power level developed by final amplifiers 104 is proportional to the drive current applied thereto by AOC circuitry 112.

AOC circuitry 112 in FIG. 1 detects the magnitude of the RF signal from final amplifiers 104 and varies the drive current applied to final amplifiers 104 for maintaining the magnitude of the final amplifier output at one of several predetermined magnitudes selected by a plurality of AOC signals. In the preferred embodiment, three AOC signals are used to select one of eight different output power levels ranging from nine milliwatts to five watts, a dynamic range of twenty-eight dB. The AOC circuitry of the present invention maintains the output power level to within plus and minus one-half dB of the selected level over temperature. Furthermore, the output power level is also accurately controlled by the unique AOC circuitry over a wide range of RF signal frequencies.

Figure 2:
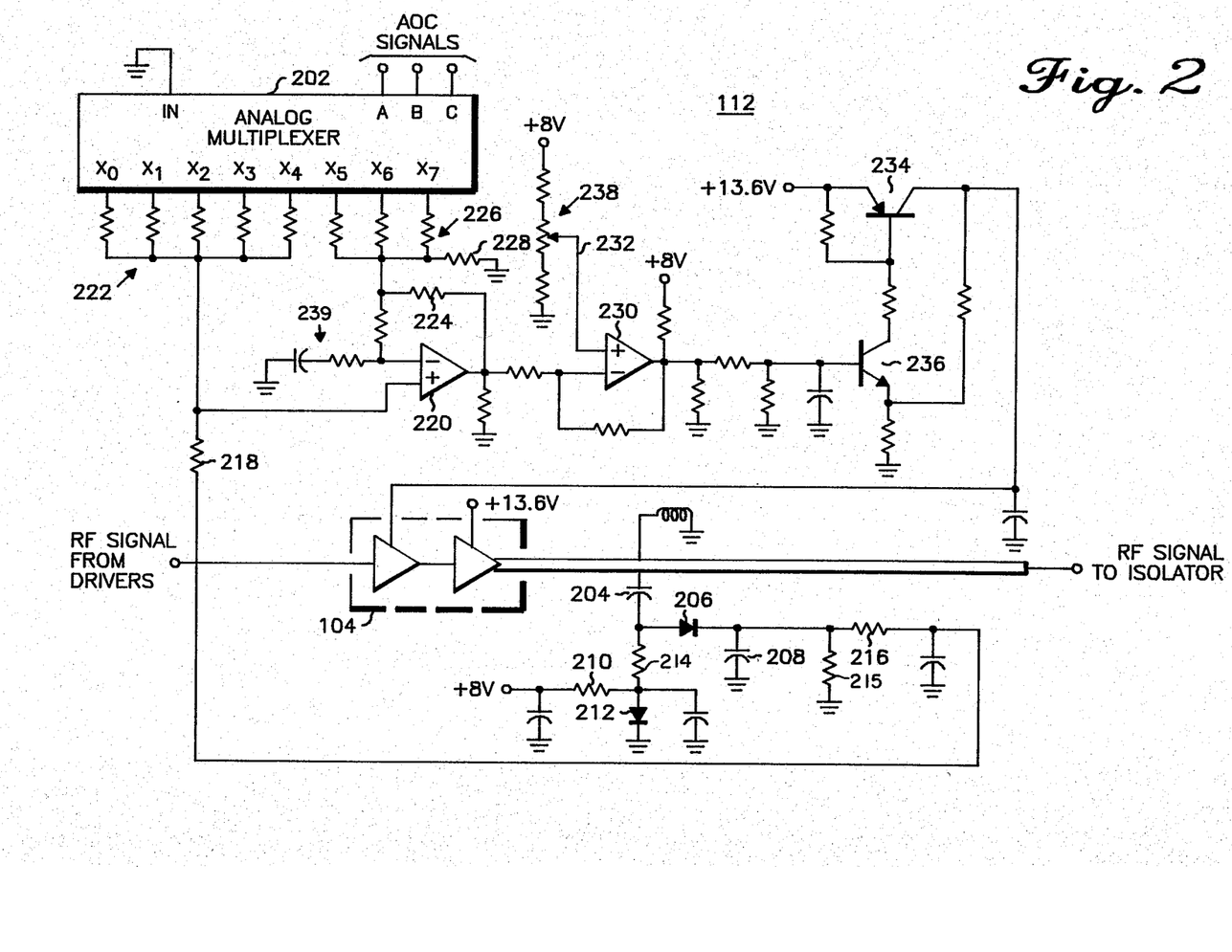
FIG. 2 is a detailed circuit diagram of the automatic output control circuitry in FIG. 1.

Referring to FIG. 2, there is illustrated a detailed circuit diagram of AOC circuitry 112 in FIG. 1. Three AOC signals are coupled to analog multiplexer 202 which applies signal ground to one of eight different resistors 222 and 226 depending on the binary state of each of the AOC signals. The AOC signals can be provided by a signal source, such as the radio control circuitry described in the aforementioned instruction manual number 68P81039E25.

The output from final drivers 104 in FIG. 2 is coupled by capacitor 204 to a half wave rectifier formed by diode 206 and capacitor 208. The voltage at the anode of diode 206 is biased to a predetermined voltage by means of resistor 210, diode 212 and resistor 214. According to a feature of the present invention, diode 212 also compensates for variations in the forward voltage drop across diode 206 due to temperature. Furthermore, forward biasing diode 206 allows for a lower value resistor 215, resulting in improved performance in high humidity environments. The voltage produced by the rectifier formed by diode 206 and capacitor 208 varies from a minimum of one-half volt when the final drivers 104 are operating at the lowest power setting to approximately fifteen volts when final drivers 104 are operating at the highest power setting.

The output power voltage from capacitor 206 in FIG. 2 is applied to the plus input of amplifier 220 by way of resistors 216 and 218. The gain of amplifier 220 is varied by grounding one of the eight resistors 222 and 226 selected by the AOC signals. When resistors 222 are selected, the gain of amplifiers 220 is two, and the output power voltage is attenuated. When resistors 226 are selected, the gain of amplifier 220 is varied, and the output power voltage is not attenuated. Analog multiplexer 202 applies ground to one of eight resistors 222 and 226 in response to one of eight binary states provided by the three AOC signals. Analog multiplexer 202 may be a Motorola type MC14051 CMOS integrated circuit. The values of resistors 222 and 226 are chosen so that the output of amplifier 220 will have substantially the same magnitude for each of the eight power level settings corresponding to output power voltages ranging from one-half volt to fifteen volts. Since the operating voltage of AOC circuitry 112 is eight volts in the preferred embodiment, high output power voltages from approximately two to fifteen volts corresponding to high power settings are selected by selectively grounding resistors 222. The attenuation is provided by a voltage divider formed by resistor 218 and the grounded resistor 222. Conversely, output power voltages from approximately one-half to two volts corresponding to low power settings are selected by selectively grounding resistors 226. The gain of amplifier 220 is determined by the feedback resistance provided by resistor 224 and the parallel resistance of resistor 228 and the grounded resistor 226. Although the gain of amplifier 220 has been varied by grounding resistors 222 and 226, the gain of amplifier 220 could also be varied by varying the resistance of resistors 224 and 228. Thus, according to an important feature of the present invention, amplifier 220 either attenuates or amplifies the output power voltage depending on which of resistors 222 and 226 is grounded.

The output of amplifier 220 in FIG. 2 is applied to the minus input of comparator 230. Comparator 230 controls current amplifier 234 by way of base drive transistor 236. The drive current signal from current amplifier 234 is coupled to final amplifiers 104 for varying the power output of final amplifiers 104. The power output of final amplifiers 104 is increased as the drive current signal increases, and vice versa.

The positive input of comparator 230 in FIG. 2 is a reference voltage 232 provided by two resistors and a potentiometer 238. During manufacture of the RF signal amplifier, potentiometer 238 is varied to produce the desired power output from final amplifiers for the highest power level setting. In the preferred embodiment, the electrical circuit component values were selected so that the reference voltage 232 is approximately four volts. In operation, comparator 230 varies the drive current signal from current amplifier 234 to maintain the magnitude of the output of amplifier 230 substantially the same as the magnitude of the reference voltage 238.

The loop response time of AOC circuitry 112 is on the order of one millisecond. The loop turn-on time is primarily determined by the circuitry coupled to the base of transistor 236. Power level switching time is primarily determined by the series-coupled resistor and capacitor 239 coupled to the negative input of amplifier 230. Thus, AOC circuitry 112 has both a fast turn-on time and a fast power level switching time.

In summary, improved AOC circuitry for RF signal power amplifiers has been described that provides a wide range of output power settings by varying amplification factors in developing the drive current signal applied to the amplifier. Furthermore, the AOC circuitry is temperature compensated so that the selected output power level is maintained over a wide range of temperatures. The improved AOC circuitry of the present invention can be advantageously utilized in any suitable application where it is desired to accurately maintain over temperature and frequency variations the output of an RF signal power amplifier at a selected one of several output power levels.

We claim:

1. Control circuitry for maintaining the magnitude of a radio frequency (RF) signal from an RF signal amplifier at one of a plurality of levels selected by level control signals from a signal source, the amplification of the RF signal amplifier being proportional to a drive current signal provided by current amplifying means, and the current amplifying means varying the magnitude of the drive current signal in response to a current control signal, said control circuitry comprising:

means coupled to the RF signal amplifier for generating an output power signal having a magnitude that is proportional to the magnitude of the RF signal from the RF signal amplifier;

means coupled to the generating means for compensating the output power signal for variations in temperature;

means coupled to the level control signals for selecting one of a plurality of amplification factors in response to the level control signals;

means coupled to the generating means for amplifying the output power signal by the selected amplification factor; and means coupled to the amplifying means for varying the magnitude of the current control signal in response to the difference between the magnitude of the amplified output power signal and a predetermined magnitude.

2. The control circuitry according to claim 1, wherein said amplifying means as a preselected amplification factor and said selecting means further includes means coupled to the generating means for attenuating the output power signal in response to the level control signal for selecting one of the amplification factors.

3. The control circuitry according to claim 1, wherein said amplifying means includes first and second impedance means for determining the amplification factor of the amplifying means, and wherein said selecting means further includes means for varying one of the first or second impedance means in response to the level control signals for selecting the amplification factor of the amplifying means.

4. The control circuitry according to claim 1, wherein said generating means includes means for half-wave rectifying the RF signal from the RF signal amplifier to produce the output power signal.

5. The control circuitry according to claim 4, wherein said half-wave rectifying means includes first diode means having a cathode terminal and an anode terminal coupled to the RF signal, and capacitive means coupled between the cathode terminal of the first diode means and signal ground; and wherein the compensating means includes first resistive means having a first terminal and a second terminal coupled to the anode of the first diode means, second diode means having an anode terminal coupled to the first terminal of the first resistive means and a cathode terminal coupled to signal ground, and second resistive means having a first terminal coupled to the second terminal of the first resistive means and a second terminal coupled to a voltage signal from a voltage source.

6. Control circuitry for maintaining the magnitude of a radio frequency (RF) signal from an RF signal amplifier at one of a plurality of levels selected by level control signals from a signal source, the amplification of the RF signal amplifier being proportional to a drive current signal provided by current amplifying means, and the current amplifying means varying the magnitude of the drive current signal in response to a current control signal, said control circuitry comprising:

means coupled to the RF signal amplifier for generating an output power signal having a magnitude that is proportional to the magnitude of the RF signal from the RF signal amplifier;

means coupled to the generating means for compensating the output power signal for variations in temperature;

means coupled to the generating means and level control signals for attenuating the output power signal by an attenuation factor selected by the level control signals;

means coupled to the attenuating means for amplifying the attenuated output power signal by a predetermined amplification factor; and     means coupled to the amplifying means for varying the magnitude of the current control signal in response to the difference between the magnitude of the amplified output power signal and a predetermined magnitude.

7. The control circuitry according to claim 6, wherein said attenuating means includes resistive divider means including series resistor means coupled between the generating means and amplifying means and a plurality shunt resistor means each coupled to the intercoupled series resistive means and the amplifying means and selectively coupled to signal ground in response to the level control signals.

8. The control circuitry according to claim 6, wherein said amplifying means includes first and second impedance means for determining the amplification factor of the amplifying means, and said amplifying means further includes means for varying one of the first or second impedance means in response to the level control signals for selecting the amplification factor of the amplifying means.

9. The control circuitry according to claim 6, wherein said generating means includes means for half-wave rectifying the RF signal from the RF signal amplifier to produce the output power signal.

10. The control circuitry according to claim 9, wherein said half-wave rectifying means includes first diode means having a cathode terminal and an anode terminal coupled to the RF signal, and capacitive means coupled between the cathode terminal of the first diode means and signal ground; and wherein the compensating means includes first resistive means having a first terminal and a second terminal coupled to the anode of the first diode means, second diode means having an anode terminal coupled to the second terminal of the first resistive means and a cathode terminal coupled to signal ground, and second resistive means having a first terminal coupled to the first terminal of the first resistive means and a second terminal coupled to a voltage signal from a voltage source.

11. Control circuitry for maintaining the magnitude of a radio frequency (RF) signal from an RF signal amplifier at one of a plurality of levels selected by level control signals from a signal source, the amplification of the RF signal amplifier being proportional to a drive current signal provided by current amplifying means, and the current amplifying means varying the magnitude of the drive current signal in response to a current control signal, said control circuitry comprising:

means coupled to the RF signal amplifier for generating an output power signal having a magnitude that is related to the magnitude of the RF signal from the RF signal amplifier;

means coupled to the generating means for compensating the output power signal for variations in temperature and coupled to the level control signals for adjusting the output power signal by an adjustment factor selected in response to the level control signals; and     means responsive to the magnitude of the compensated and adjusted output power signal for producing the current control signal.

12. The control circuitry according to claim 11, wherein said compensating and adjusting means includes means responsive to the level control signals for selecting one of a plurality of adjustment factors.

13. The control circuitry according to claim 11, wherein said compensating and adjusting means includes means for attenuating the output power signal in response to the selected adjustment factor.

14. The control circuitry according to claim 13, wherein said attenuating means includes resistive divider means including series resistive means and a plurality of shunt resistive means each coupled to the series resistive means and selectively coupled to signal ground in response to the level control signals.

15. The control circuitry according to claim 11, further including amplifying means for amplifying the compensated and adjusted output power signal by a predetermnined amplification factor.

16. The control circuitry according to claim 15, wherein said amplifying means includes variable impedance means for determining the amplification factor thereof, and wherein said control circuitry further includes means for varying said impedance means in response to the selected adjustment factor.

17. The control circuitry according to claim 11, wherein said producing means includes means for varying the current control signal in response to the difference between the magnitude of the compensated and adjusted output power signal and a predetermined magnitude.

18. The control circuitry according to claim 11, wherein said generating means includes means for half-wave rectifying the RF signal from the RF signal amplifier to produce the output power signal.

19. The control circuitry according to claim 18, wherein said half-wave rectifying means includes first diode means having a cathode terminal and having an anode terminal coupled to the RF signal, and capacitive means coupled between the cathode terminal of the first diode means and signal ground; and said compensating and adjusting means further includes first resistive means having a first terminal and having a second terminal coupled to the anode of the first diode means, second diode means having an anode terminal coupled to the first terminal of the first resistive means and a cathode terminal coupled to signal ground, and second resistive means having a first terminal coupled to the first terminal of the first resistive means and a second terminal coupled to a voltage signal from a voltage source.

20. Control circuitry for maintaining the magnitude of a radio frequency (RF) signal from an RF signal amplifier at one of a plurality of levels selected by level control signals from a signal source, the amplification of the RF signal amplifier being proportional to a drive current signal provided by current amplifying means, and the current amplifying means varying the magnitude of the drive current signal in response to a current control signal, said control circuitry comprising:

means coupled to the RF signal amplifier for generating an output power signal having a magnitude that is related to the magnitude of the RF signal from the RF signal amplifier;

means coupled to the generating means for compensating the output power signal for variations in temperature and coupled to the level control signals for attenuating the output power signal by an attenuation factor selected by the level control signals; and means responsive to the magnitude of the compensated and attenuated output power signal for producing the current control signal.

21. The control circuitry according to claim 20, wherein said compensating and attenuating means includes means responsive to the level control signals for selecting one of a plurality of attenuation factors.

22. The control circuitry according to claim 20, wherein said compensating and attenuating means includes resistive divider means including series resistive means and a plurality of shunt resistive means each coupled to the series resistive means and selectively coupled to signal ground in response to the level control signals.

23. The control circuitry according to claim 20, further including amplifying means for amplifying the compensated and attenuated output power signal by a predetermined amplification factor.

24. The control circuitry according to claim 23, wherein said amplifying means includes variable impedance means for determining the amplification factor thereof, and said control circuitry further includes means for varying said impedance means in response to the selected attenuation factor.

25. The control circuitry according to claim 20, wherein said producing means includes means for varying the current control signal in response to the difference between the magnitude of the compensated and attenuated output power signal and a predetermined magnitude.

26. The control circuitry according to claim 20, wherein said generating means includes means for half-wave rectifying the RF signal from the RF signal amplifier to produce the output power signal.

27. The control circuitry according to claim 26, wherein said half-wave rectifying means includes first diode means having a cathode terminal having and an anode terminal coupled to the RF signal, and capacitive means coupled between the cathode terminal of the first diode means and signal ground; and said compensating and attenuating means further includes first resistive means having a first terminal and having a second terminal coupled to the anode of the first diode means, second diode means having an anode terminal coupled to the first terminal of the first resistive means and a cathode terminal coupled to signal ground, and second resistive means having a first terminal coupled to the first terminal of the first resistive means and a second terminal coupled to a voltage signal from a voltage source.

28. Amplifying circuitry for producing a plurality of levels of a radio frequency (RF) signal selected by level control signals from a signal source, said amplifying circuitry comprising:

means responsive to a current control signal for amplifying the RF signal;

means coupled to the amplifying means for generating an output power signal having a magnitude that is related to the magnitude of the amplified RF signal therefrom;

means coupled to the generating means for compensating the output power signal for variations in temperature and coupled to the level control signals for adjusting the output power signal by an adjustment factor selected by the level control signals; and means responsive to the magnitude of the compensated and adjusted output power signal for producing the current control signal.

29. The control circuitry according to claim 28, wherein said compensating and adjusting means includes means responsive to the level control signals for selecting one of a plurality of adjustment factors.

30. The control circuitry according to claim 28, wherein said compensating and adjusting means includes means for attenuating the output power signal in response to the selected adjustment factor.

31. The control circuitry according to claim 30, wherein said attenuating means includes resistive divider means including series resistive means and a plurality of shunt resistive means each coupled to the series resistive means and selectively coupled to signal ground in response to the level control signals.

32. The control circuitry according to claim 28, further including amplifying means for amplifying the compensated and adjusted output power signal by a predetermined amplification factor.

33. The control circuitry according to claim 32, wherein said amplifying means includes variable impedance means for determining the amplification factor thereof, and wherein said control circuitry further includes means for varying said impedance means in response to the selected adjustment factor.

34. The control circuitry according to claim 28, wherein said producing means includes means for varying the current control signal in response to the difference between the magnitude of the compensated and adjusted output power signal and a predetermined magnitude.

35. The control circuitry according to claim 28, wherein said generating means includes means for half-wave rectifying the RF signal from the amplifying means to produce the output power signal.

36. The control circuitry according to claim 35, wherein said half-wave rectifying means includes first diode means having a cathode terminal and having an anode terminal coupled to the RF signal, and capacitive means coupled between the cathode terminal of the first diode means and signal ground; and said compensating and adjusting means further includes first resistive means having a first terminal and having a second terminal coupled to the anode of the first diode means, second diode means having an anode terminal coupled to the first terminal of the first resistive means and a cathode terminal coupled to signal ground, and second resistive means having a first terminal coupled to the first terminal of the first resistive means and a second terminal coupled to a voltage signal from a voltage source.

37. Circuitry for controlling the magnitude of a radio frequency (RF) signal in response to control signals comprising:
   means, having variable output, for amplifying the RF signal to an output magnitude;
   means for generating an output power signal having a magnitude related to said RF signal output magnitude;
   means for compensating said output power signal magnitude for variations in temperature and adjusting said output power signal by an adjustment factor selected by the control signals; and
   means, responsive to said compensated and adjusted output power signal, for varying said RF signal amplifying means output to produce a corresponding magnitude of the RF signal.

38. The control circuitry according to claim 37, wherein said compensating and adjusting means includes means responsive to the level control signals for selecting one of a plurality of adjustment factors.

39. The control circuitry according to claim 37, wherein said compensating and adjusting means includes means for attenuating the output power signal in response to the selected adjustment factor.

40. The control circuitry according to claim 39, wherein said attenuating means includes resistive divider means including series resistive means and a plurality of shunt resistive means each coupled to the series resistive means and selectively coupled to signal ground in response to the level control signals.

41. The control circuitry according to claim 37, further including amplifying means for amplifying the compensated and adjusted output power signal by a predetermined amplification factor.

42. The control circuitry according to claim 41, wherein said amplifying means includes variable impedance means for determining the amplification factor thereof, and wherein said control circuitry further includes means for varying said impedance means in response to the selected adjustment factor.

43. The control circuitry according to claim 37, wherein said producing means includes means for varying the current control signals in response to the difference between the magnitude of the compensated and adjusted output power signal and a predetermined magnitude.

44. The control circuitry according to claim 37, wherein said generating means includes means for half-wave rectifying the RF signal from the RF amplifying means to produce the output power signal.

45. The control circuitry according to claim 44, wherein said half-wave rectifying means includes first diode means having a cathode terminal and having an anode terminal coupled to the RF signal, and capacitive means coupled between the cathode terminal of the first diode means and signal ground; and said compensating and adjusting means further includes first resistive means having a first terminal and having a second terminal coupled to the anode of the first diode means, second diode means having an anode terminal coupled to the first terminal of the first resistive means and a cathode terminal coupled to signal ground, and second resistive means having a first terminal coupled to the first terminal of the first resistive means and a second terminal coupled to a voltage signal from a voltage source.

46. Control circuitry for maintaining the magnitude of a radio frequency (RF) signal from an RF signal amplifier at one of a plurality of levels selected by level control signals from a signal source, the amplification of the RF signal amplifier being proportional to a drive current signal provided by current amplifying means, and the current amplifying means varying the magnitude of the drive current signal in response to a current control signal, said control circuitry comprising:
   means coupled to the RF signal amplifier for generating an output power signal having a magnitude that is related to the magnitude of the RF signal from the RF signal amplifier;
   means coupled to the generating means for compensating the output power signal for variations in temperature;
   means coupled to the level control signals for adjusting the compensated output power signal by an adjustment factor selected in response to the level control signals; and
   means responsive to the magnitude of the adjusted output power signal for producing the current control signal.

47. Control circuitry for maintaining the magnitude of a radio frequency (RF) signal from an RF signal amplifier at one of a plurality of levels selected by level control signals from a signal source, the amplification of the RF signal amplifier being proportional to a drive current signal provided by current amplifying means, and the current amplifying means varying the magnitude of the drive current signal in response to a current control signal, said control circuitry comprising:
   means coupled to the RF signal amplifier for generating an output power signal having a magnitude that is related to the magnitude of the RF signal from the RF signal amplifier;
   means coupled to the generating means for compensating the output power signal for variations in temperature;
   means coupled to the level control signals for attenuating the compensated output power signal by an attenuation factor selected by the level control signals; and
   means responsive to the magnitude of the attenuated output power signal for producing the current control signal.

48. Amplifying circuitry for producing a plurality of levels of a radio frequency (RF) signal selected by level control signals from a signal source, said amplifying circuitry comprising:
   means responsive to a current control signal for amplifying the RF signal;
   means coupled to the amplifying means for generating an output power signal having a magnitude that is related to the magnitude of the amplified RF signal therefrom;
   means coupled to the generating means for compensating the output power signal for variations in temperature;
   means coupled to the level control signals for adjusting the compensated output power signal by an adjustment factor selected by the level control signals; and means responsive to the magnitude of the adjusted output power signal for producing the current control signal.

49. Circuitry for controlling the magnitude of a radio frequency (RF) signal in response to control signals, comprising:
  means, having variable output, for amplifying the RF signal to an output magnitude;
  means for generating an output power signal having a magnitude related to said RF signal output magnitude;
  means for compensating said output power signal magnitude for variations in temperature;
  means for adjusting said compensated output power signal by an adjustment factor selected by the control signals; and
  means, responsive to said adjusted output power signal, for varying said output of said RF signal amplifying means to produce a corresponding output magnitude of the RF signal.

50. Control circuitry for maintaining the magnitude of a radio frequency (RF) signal from an RF signal amplifier at one of a plurality of levels selected by level control signals from a signal source, the amplification of the RF signal amplifier being proportional to a drive current signal provided by current amplifying means, and the current amplifying means varying the magnitude of the drive current signal in response to a current control signal, said control circuitry comprising:
  means coupled to the RF signal amplifier for generating an output power signal having a magnitude that is related to the magnitude of the RF signal from the RF signal amplifier, and compensating the output power signal for variations in temperature;
  means coupled to the level control signals for selecting one of a plurality of amplification factors in response to the level control signals;
  means coupled to the generating and compensating means for amplifying the output power signal by the selected amplification factor; and
  means coupled to the amplifying means for varying the magnitude of the current control signal in response to the difference between the magnitude of the amplified output power signal and a predetermined magnitude.

51. The control circuitry according to claim 50, wherein said amplifying means has a preselected amplification factor and said selecting means further includes means coupled to the generating means for attenuating the output power signal in response to the level control signals for selecting one of the amplification factors.

52. The control circuitry according to claim 50, wherein said amplifying means includes first and second impedance means for determining the amplification factor of the amplifying means, and wherein said selecting means further includes means for varying one of the first or second impedance means in response to the level control signals for selecting the amplification factor of the amplifying means.

53. The control circuitry according to claim 50, wherein said generating means includes means for rectifying the RF signal from the RF signal amplifier to produce the output power signal.

54. The control circuitry according to claim 53, wherein said rectifying means includes first diode means having a cathode terminal and an anode terminal coupled to the RF signal, and capacitive means coupled between the cathode terminal of the first diode means and signal ground; and first resistive means having a first terminal and a second terminal coupled to the anode of the first diode means, second diode means having an anode terminal coupled to the first terminal of the first resistive means and a cathode terminal coupled to signal ground, and second resistive means having a first terminal coupled to the second terminal of the first resistive means and a second terminal coupled to a voltage signal from a voltage source thereby supplying a bias for said first diode means.

55. Control circuitry for maintaining the magnitude of a radio frequency (RF) signal from an RF signal amplifier at one of a plurality of levels selected by level control signals from a signal source, the amplification of the RF signal amplifier being proportional to a drive current signal provided by current amplifying means, and the current amplifying means varying the magnitude of the drive current signal in response to a current control signal, said control circuitry comprising:
  means coupled to the RF signal amplifier for generating an output power signal having a magnitude that is related to the magnitude of the RF signal from the RF signal amplifier, and compensating the output power signal for variations in temperature;
  means coupled to the generating and compensating means for attenuating the output power signal by an attenuation factor selected by the level control signals;
  means coupled to the attenuating means for amplifying the attenuated output power signal by a predetermined amplification factor; and
  means coupled to the amplifying means for varying the magnitude of the current control signal in response to the difference between the magnitude of the amplified output power signal and a predetermined magnitude.

56. The control circuitry according to claim 55, wherein said attenuating means includes resistive divider means including series resistor means coupled between the generating means and amplifying means and a plurality shunt resistor means selectively coupled among said series resistor means, amplifying means, and signal ground in response to the level control signals.

57. The control circuitry according to claim 55, wherein said amplifying means includes first and second impedance means for determining the amplification factor of the amplifying means, and said amplifying means further includes means for varying one of the first or second impedance means in response to the level control signals for selecting the amplification factor of the amplifying means.

58. The control circuitry according to claim 55, wherein said generating means includes means for rectifying the RF signal from the RF signal amplifier to produce the output power signal.

59. The control circuitry according to claim 58, wherein said rectifying means includes first diode means having a cathode terminal and an anode terminal coupled to the RF signal, and capacitive means coupled between the cathode terminal of the first diode means and signal ground; and first resistive means having a first terminal and a second terminal coupled to the anode of the first diode means, second diode means having an anode terminal coupled to the first terminal of the first resistive means and a cathode terminal coupled to signal ground, and second resistive means having a first terminal coupled to the second terminal of the first resistive means and a second terminal coupled to a voltage signal from a voltage source thereby supplying a bias for said first diode means.

60. Amplifying circuitry for producing a plurality of levels of a radio frequency (RF) signal selected by level control signals from a signal source, said amplifying circuitry comprising:
   means responsive to a current control signal for amplifying the RF signal;
   means coupled to the RF amplifying means for generating an output power signal having a magnitude that is related to the magnitude of the amplified RF signal therefrom, and compensating the output power signal for variations in temperature;
   means coupled to the level control signals for adjusting the output power signal by an adjustment factor selected by the level control signals;
   means coupled to the adjusting means for amplifying the adjusted output power signal; and
   means responsive to the magnitude of the amplified output power signal for producing the current control signal.

61. Circuitry for controlling the magnitude of a radio frequency (RF) signal in response to control signals, comprising:
   means, having variable output, for amplifying the RF signal to an output magnitude;
   means for generating an output power signal having a magnitude related to said RF signal output magnitude, and compensating the output power signal for variations in temperature;
   means for adjusting said output power signal by an adjustment factor selected by the control signals;
   means coupled to the adjusting means for amplifying the adjusted output power signal; and
   means, responsive to said amplified output power signal, for varying said output of said RF signal amplifying means to produce a corresponding output magnitude of the RF signal.

62. Control circuitry for maintaining the magnitude of a radio frequency (RF) signal from an RF signal amplifier at one of a plurality of levels selected by level control signals from a signal source, the amplification of the RF signal amplifier being proportional to a drive current signal provided by current amplifying means, and the current amplifying means varying the magnitude of the drive current signal in response to a current control signal, said control circuitry comprising:
   means coupled to the RF signal amplifier for generating an output power signal having a magnitude that is related to the magnitude of the RF signal from the RF signal amplifier;
   means coupled to the generating means for compensating the output power signal for variations in temperature; and
   means responsive to the magnitude of the output power signal and the level control signals for producing the current control signal.

63. Control circuitry in accordance with claim 62 wherein the control circuitry further comprises means for amplifying said output power signal.

64. Control circuitry in accordance with claim 62 wherein said means for generating an output power signal is a first diode rectifier.

65. Control circuitry in accordance with claim 64 wherein said means for compensating the output power signal further comprises a second diode resistively coupled to said first diode and a direct current power source whereby temperature variations in said first diode are compensated by direct current bias from said second diode.

66. Control circuitry in accordance with claim 62 wherein said means for producing the current control signal further comprises means for selecting one of a plurality of resistance values in an attenuation network whereby the current control signal is responsive to the level control signals.

67. Control circuitry in accordance with claim 62 wherein said means for producing the current control signal further comprises comparing means responsive to the output power signal for generating the current control signal.

68. Amplifying circuitry for producing and maintaining one of a plurality of predetermined levels of a radio frequency (RF) signal selected by level control signals from a signal source, said amplifying circuitry comprising:
   means responsive to a current control signal for amplifying the RF signal;
   means coupled to the amplifying means for generating an output power signal having a magnitude that is related to the magnitude of the amplified RF signal therefrom;
   means coupled to the generating means for compensating the output power signal for variations in temperature; and
   means responsive to the magnitude of the output power signal and the level control signals for producing the current control signal.

69. Amplifying circuitry in accordance with claim 68 wherein the amplifying circuitry further comprises:
   means for amplifying said output power signal;
   first diode means for rectifying the RF signal;
   second diode means resistively coupled to said first diode means whereby temperature variations in said first diode means are compensated by bias from said second diode means;
   means for selecting one of a plurality of resistance values in an attenuation network whereby the current control signal is responsive to the level control signals; and
   means for comparing the output power signal to a predetermined magnitude and generating the current control signal.

70. Control circuitry for maintaining the magnitude of a radio frequency (RF) signal from an RF signal amplifier at one of a plurality of levels selected by level control signals from a signal source, the amplification of the RF signal amplifier being proportional to a drive current signal provided by current amplifying means, and the current amplifying means varying the magnitude of the drive current signal in response to a current control signal, said control circuitry comprising:
   means coupled to the RF signal amplifier for generating an output signal having a magnitude that is related to the level control signals and the magnitude of the RF signal from the RF signal amplifier;
   means coupled to said generating means for compensating said output signal for variations in temperature; and
   means responsive to the magnitude of the output signal for producing the current control signal.

71. Control circuitry in accordance with claim 70 wherein the control circuitry further comprises means for amplifying said output signal.

72. Control circuitry in accordance with claim 70 wherein said means for generating an output signal further comprises a first diode means rectifier.

73. Control circuitry in accordance with claim 72 wherein said means for compensating said output signal further comprises a second diode means coupled to said first diode means whereby temperature variations in said first diode means are compensated by direct current bias from said second diode means.

74. Control circuitry in accordance with claim 70 wherein said means for generating an output signal further comprises means, responsive to the level control signals, for selecting one of a plurality of resistance values in an attenuation network.

75. Amplifying circuitry for producing and maintaining one of a plurality of predetermined levels of a radio frequency (RF) signal selected by level control signals from a signal source, said amplifying circuitry comprising:

means responsive to a current control signal for amplifying the RF signal;
means coupled to the amplifying means for generating an output signal having a magnitude that is related to the level control signals and the magnitude of the RF signal from the RF signal amplifying means;
means coupled to the generating means for compensating the output signal for variations in temperature; and
means responsive to the magnitude of the compensated output signal for producing the current control signal.

76. Amplifying circuitry in accordance with claim 75 wherein the amplifying circuitry further comprises:

means for amplifying said output signal;
first diode means for rectifying the RF signal;
second diode means resistively coupled to said first diode means whereby temperature variations in said first diode means are compensated by bias from said second diode means; and
means, responsive to the level control signals, for selecting one of a plurality of resistance values in an attenuation network.

77. Control circuitry for establishing the magnitude of a radio frequency (RF) signal from an RF signal amplifier at one of a plurality of contiguous levels selected by level control signals from a signal source, the amplification of the RF signal amplifier being proportional to a drive current signal provided by current amplifying means, and the current amplifying means varying the magnitude of the drive current signal in response to a current control signal, said control circuitry comprising:

means coupled to the RF signal amplifier for generating an output power signal having a magnitude that is related to the magnitude of the RF signal from the RF signal amplifier;
means coupled to the generating means for maintaining the output power signal at a magnitude such that the RF signal magnitude is held at the selected level within a predetermined window of accuracy over variations in temperature; and
means responsive to the magnitude of the output power signal and the level control signals for producing the current control signal.

78. Control circuitry in accordance with claim 77 wherein the control circuitry further comprises means for amplifying said output power signal.

79. Control circuitry in accordance with claim 77 wherein said output power signal generating means is a first diode rectifier.

80. Control circuitry in accordance with claim 77 wherein said means for maintaining the RF signal magnitude further comprises a second diode resistively coupled to said first diode and a direct current power source thereby compensating temperature variations in said first diode by direct current bias from said second diode and maintaining the RF signal magnitude at the selected level.

81. Control circuitry in accordance with claim 77 wherein said means for producing the current control signal further comprises means for selecting one of a plurality of resistors in an attenuation network whereby the current control signal is responsive to the level control signal.

82. Control circuitry in accordance with claim 77 wherein said means for producing the current control signal further comprises means for comparing the output power signal to a predetermined magnitude and producing the current control signal.

83. Amplifying circuitry for producing a plurality of contiguous levels of a radio frequency (RF) signal selected by level control signals from a signal source, said amplifying circuitry comprising:

an RF amplifier responsive to a current control signal for amplifying the RF signal;
a rectifier, coupled to said RF amplifier, for generating an output power signal having a magnitude that is related to the magnitude of the amplified RF signal;
a thermally variable element, coupled to the rectifier, for maintaining the output power signal at a magnitude such that the RF signal magnitude is held at the selected level within a predetermined window of accuracy;
an output power signal amplifier, coupled to said half wave rectifier for amplifying and comparing the output power signal to a reference magnitude to produce said current control signal; and
an attenuator, coupled to said output power signal amplifier, for adjusting said current control signal in accordance with the level control signals.

84. Amplifying circuitry in accordance with claim 83 wherein said thermally variable element further comprises a diode resistively coupled to said half wave rectifier and a direct current power source whereby temperature variations in said half wave rectifier are compensated by direct current bias from the diode.

85. Amplifying circuitry in accordance with claim 83 wherein said attenuator further comprises an analog multiplexer for selecting one of a plurality of resistance values in response to the level control signals.

* * * * *

UNITED STATES PATENT AND TRADEMARK OFFICE
CERTIFICATE OF CORRECTION

PATENT NO. : 4,523,155
DATED : June 11, 1985
INVENTOR(S) : WALCZAK, Thomas J., et al.

It is certified that error appears in the above-identified patent and that said Letters Patent is hereby corrected as shown below:

In Column 4, line 47, delete "as" and insert --has--.

In Column 4, line 51, delete "signal" and insert --signals--.

In Column 5, line 8, delete "second" and insert --first--.

In Column 5, line 13, delete "pluraity" and insert --plurality--.

In Column 5, line 68, delete "second" and insert --first--.

In Column 6, line 45, delete "predetermnined" and insert --predetermined--.

*Signed and Sealed this*

*Twenty-second* Day of *October 1985*

[SEAL]

*Attest:*

*Attesting Officer*

DONALD J. QUIGG

*Commissioner of Patents and Trademarks—Designate*